(12) United States Patent
Leopold et al.

(10) Patent No.: US 11,073,872 B2
(45) Date of Patent: Jul. 27, 2021

(54) DISTRIBUTED AUXILIARY HUB FOR A PORTABLE ELECTRONIC DEVICE

(71) Applicant: Apple Inc., Cupertino, CA (US)

(72) Inventors: Andrew U. Leopold, San Francisco, CA (US); Owen D. Hale, Oakland, CA (US); Daniel W. Jarvis, Sunnyvale, CA (US); David A. Pakula, San Francisco, CA (US); James B. Smith, San Francisco, CA (US); Ian A. Spraggs, San Francisco, CA (US); Gregory N. Stephens, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/818,680

(22) Filed: Mar. 13, 2020

(65) Prior Publication Data
US 2021/0072801 A1 Mar. 11, 2021

Related U.S. Application Data

(60) Provisional application No. 62/897,153, filed on Sep. 6, 2019.

(51) Int. Cl.
*G06F 1/16* (2006.01)
*H05K 7/02* (2006.01)
(Continued)

(52) U.S. Cl.
CPC ........... *G06F 1/1684* (2013.01); *H01R 12/52* (2013.01); *H02J 7/02* (2013.01); *H02J 50/10* (2016.02);
(Continued)

(58) Field of Classification Search
CPC .......... G06F 1/1684; H02J 50/10; H02J 7/02; H04R 12/52; H04R 1/025; H04R 3/00; H04R 2499/11; H04R 2499/15; H05K 1/18; H05K 7/026; H05K 9/0024; H05K 2201/09063; H05K 2201/1003; G08B 7/06
See application file for complete search history.

(56) References Cited

U.S. PATENT DOCUMENTS 5,550,710 A 8/1996 Rahamim et al.
7,097,479 B2 8/2006 Lee
(Continued)

*Primary Examiner* — Andrew L Sniezek
(74) *Attorney, Agent, or Firm* — Dickinson Wright RLLP

(57) ABSTRACT

A distributed auxiliary hub for a portable electronic device is disclosed. The distributed auxiliary hub, located on a stacked circuit assembly, can distribute electrical signals to multiple different destinations. The distributed auxiliary hub is displaced and separate from a main logic board, and as a result, can provide supplemental functions. Although the distributed auxiliary hub is electrically coupled to the main logic board, the distributed auxiliary hub includes dedicated integrated circuits responsible for executing functions related to battery charging and powering of electronic components (e.g., haptic feedback module, speaker module, etc.). As a result, the distributed auxiliary hub, when executing these aforementioned functions, is not reliant upon the main logic board to transmit electrical current to the battery and/or electronic components. The distributed auxiliary hub, when electrically coupled to an external resource, is capable of directly transmitting electrical current to electronic components.

14 Claims, 13 Drawing Sheets

(51) Int. Cl.
*H01R 12/52* (2011.01)
*H05K 9/00* (2006.01)
*H05K 1/18* (2006.01)
*H02J 50/10* (2016.01)
*H04R 1/02* (2006.01)
*H04R 3/00* (2006.01)
*H02J 7/02* (2016.01)
*G08B 7/06* (2006.01)

(52) U.S. Cl.
CPC ............... *H04R 1/025* (2013.01); *H04R 3/00* (2013.01); *H05K 1/18* (2013.01); *H05K 7/026* (2013.01); *H05K 9/0024* (2013.01); *G08B 7/06* (2013.01); *H04R 2499/11* (2013.01); *H04R 2499/15* (2013.01); *H05K 2201/09063* (2013.01); *H05K 2201/1003* (2013.01)

(56) References Cited

U.S. PATENT DOCUMENTS

| | | |
|---|---|---|
| 7,729,131 B2 | 6/2010 | Wang et al. |
| 8,154,877 B2 | 4/2012 | Sayavong |
| 8,570,736 B2 | 10/2013 | McClure et al. |
| 8,634,022 B2 | 1/2014 | Makino |
| 9,474,156 B2 | 10/2016 | Fosnes et al. |
| 10,356,903 B1 | 7/2019 | Chen et al. |
| 10,566,722 B2 * | 2/2020 | Lee .................... H01R 12/7064 |
| 2009/0256758 A1 * | 10/2009 | Schlub .................... H01Q 5/40 |
| | | 343/702 |
| 2019/0387649 A1 | 12/2019 | Hong |

* cited by examiner

DISTRIBUTED AUXILIARY HUB FOR A PORTABLE ELECTRONIC DEVICE

CROSS-REFERENCE TO RELATED APPLICATIONS

This patent application claims priority to U.S. Application No. 62/897,153 entitled "DISTRIBUTED AUXILIARY HUB FOR A PORTABLE ELECTRONIC DEVICE," filed Sep. 6, 2019, the content of which is incorporated herein by reference in its entirety for all purposes.

FIELD

The described embodiments relate generally to a circuit assembly that provides direct charging and acoustic circuitry for a portable electronic device. More particularly, the described embodiments relate to a distributed auxiliary hub that is displaced from a main logic board and capable of providing direct charging power to the main logic board, a battery, and at least one electronic component.

BACKGROUND

Recent technological and manufacturing advances have enabled manufacturers of portable electronic devices to fit more complex electronic components within a cavity of an enclosure. However, manufacturers may still rely upon a single circuit board (such as a motherboard) to execute all of the primary functions of the portable electronic device. Consequently, as portable electronic devices execute more complex functions, using a single motherboard to execute these functions is inefficient, especially while a battery of the portable electronic device is being charged.

SUMMARY

This paper describes various embodiments that relate generally to a circuit assembly that provides charging and acoustic circuitry for a portable electronic device. More particularly, the described embodiments relate to a distributed auxiliary hub that is displaced from a main logic board and capable of providing direct charging power to the main logic board, a battery, and at least one electronic component.

In one aspect, a portable electronic device is described. The portable electronic device may include an enclosure that defines a cavity. The enclosure may include a wall. The portable electronic device may further include internal components located in the cavity. The internal components may include a dock connector secured with the wall. The internal components may further include a main logic board. The internal components may further include a dock flex electrically connected to the dock connector and the main logic board. The internal components may further include a circuit assembly positioned on and electrically coupled to the dock flex. The circuit assembly may be configured to direct an electrical signal between the dock connector and the main logic board.

In another aspect, a portable electronic device is described. The portable electronic device may include an enclosure. The portable electronic device may further include a main logic board. The portable electronic device may further include a circuit assembly. The circuit assembly may include a first circuit board having a first conductive element. The circuit assembly may further include a second circuit board having a second conductive element. The circuit assembly may further include an interposer board disposed between the first circuit board and the second circuit board. In some embodiments, the interposer board includes an electrically conductive pin that is electrically connected to the first conductive element and the second conductive element. The portable electronic device may further include a flexible circuit that includes electrical contacts that electrically couple to the circuit assembly. The portable electronic device may further include a dock connector having a dock connector housing that is secured with the enclosure. In some embodiments, an electrical signal is capable of being passed between the dock connector, the stacked circuit assembly, and the main logic board.

In another aspect, a circuit assembly circuit board assembly for use with a portable electronic device is described. The circuit assembly may include a first printed circuit board that carries a first electrical contact. The circuit assembly may further include a second printed circuit board that carries a second electrical contact. The second substrate printed circuit board may include an opening. The circuit assembly may further include an interposer board mounted between the first circuit board and the second printed circuit board. The interposer board may include an electrically conductive pin that electrically connects to the first electrical contact and the second electrical contact, thereby placing the first printed circuit in electrical communication with the second circuit board. The circuit assembly may further include an inductor carried by the first printed circuit board, the inductor at least partially disposed through the opening. In some embodiments, the inductor has a first dimension and a second that is greater than the first dimension.

Other aspects and advantages of the invention will become apparent from the following detailed description taken in conjunction with the accompanying drawings which illustrate, by way of example, the principles of the described embodiments.

This Summary is provided merely for purposes of summarizing some example embodiments so as to provide a basic understanding of some aspects of the subject matter described herein. Accordingly, it will be appreciated that the above-described features are merely examples and should not be construed to narrow the scope or spirit of the subject matter described herein in any way. Other features, aspects, and advantages of the subject matter described herein will become apparent from the following Detailed Description, Figures, and Claims.

BRIEF DESCRIPTION OF THE DRAWINGS

The disclosure will be readily understood by the following detailed description in conjunction with the accompanying drawings, wherein like reference numerals designate like structural elements.

DETAILED DESCRIPTION

Figure 1A:
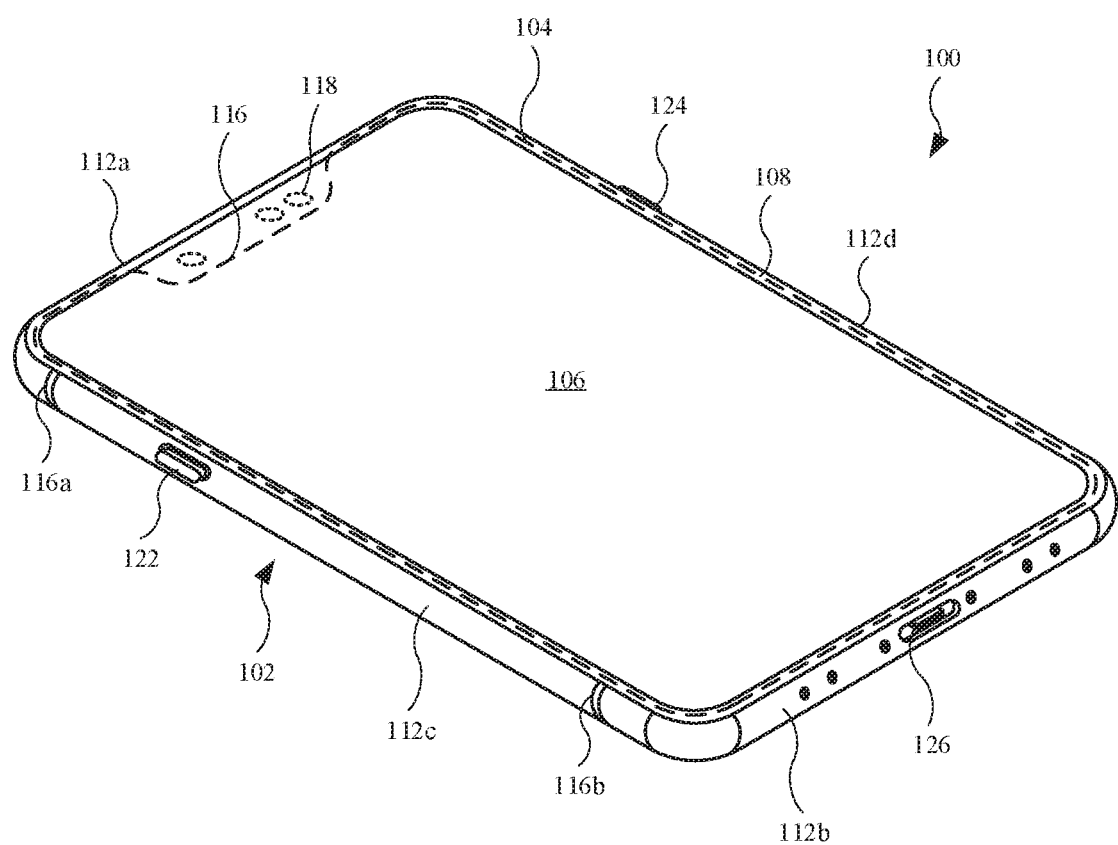
FIGS. 1A and 1B illustrate perspective views of a portable electronic device having a distributed auxiliary hub, in accordance with some embodiments.

Representative applications of methods and apparatus according to the present application are described in this section. These examples are being provided solely to add context and aid in the understanding of the described embodiments. It will thus be apparent to one skilled in the art that the described embodiments may be practiced without some or all of these specific details. In other instances, well known process steps have not been described in detail in order to avoid unnecessarily obscuring the described embodiments. Other applications are possible, such that the following examples should not be taken as limiting.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting; such that other embodiments may be used, and changes may be made without departing from the spirit and scope of the described embodiments.

Recent technological and manufacturing advances have enabled manufacturers of portable electronic devices to fit more complex electronic components within a cavity of an enclosure. However, portable electronic devices should also be relatively lightweight, compact and easy to carry around. Moreover, fitting more complex electronic components within the cavity may restrict the size of the internal battery of the portable electronic device. Consequently, limiting the size of the internal battery that is responsible for providing power to all of the components of the portable electronic device may lead to inefficiencies in battery charging. Furthermore, manufacturers may still rely upon a single motherboard to execute all of the primary functions of the portable electronic device. Consequently, as portable electronic devices execute more complex functions, the use of a single motherboard to execute these functions is inefficient, especially while a battery of the portable electronic device is being charged.

Accordingly, the embodiments described herein set forth a distributed auxiliary hub that is capable of distributing electrical signals according to multiple different electrical paths to reach different destinations. The distributed auxiliary hub is displaced and separate from the main logic board and capable of providing supplemental functions. Although the distributed auxiliary hub is electrically coupled to the main logic board via a flex cable, the distributed auxiliary hub includes dedicated integrated circuits responsible for executing functions related to battery charging and powering of electronic components (e.g., haptic feedback module, speaker module, etc.). As a result, the distributed auxiliary hub, when executing these aforementioned functions, is not reliant upon the main logic board to transmit electrical current to the battery and/or electronic components. When the distributed auxiliary hub is electrically coupled to an external resource (e.g., external battery supply, etc.) and/or receives electrical current via a wireless charging coil, the distributed auxiliary hub is capable of directly transmitting electrical current to the battery and/or electronic components. In conventional portable electronic devices, the functions of the distributed auxiliary hub would have been implemented by the main logic board.

Beneficially, positioning the distributed auxiliary hub closer to the external resource provides reduces the electrical signal path and increases charging efficiency relative to a conventional logic board. The embodiments described herein may provide the aforementioned advantages of increased charge and functional efficiency for those electronic components that are positioned closer to the distributed auxiliary hub than the main logic board.

These and other embodiments are discussed below with reference to FIGS. 1-7. However, those skilled in the art will readily appreciate that the detailed description given herein with respect to these figures is for explanatory purposes only and should not be construed as limiting.

Figure 1B:
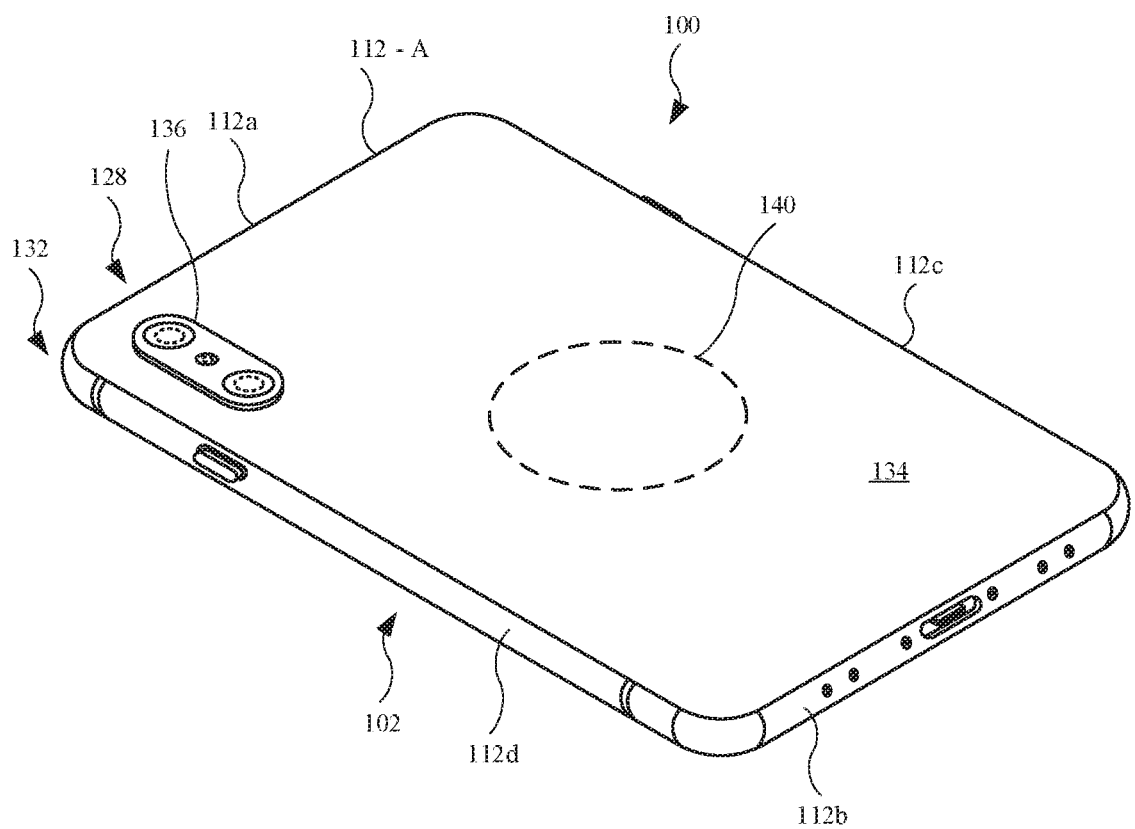

FIGS. 1A and 1B illustrate various perspective views of a portable electronic device 100. According to some examples, the portable electronic device 100 may refer to a computing device, a smartphone, a laptop, a smartwatch, a fitness tracker, a mobile phone, a wearable consumer device, and the like. According to some examples, the portable electronic device 100 carries one or more operational components within a cavity (not shown) of the portable electronic device 100. These features will be shown and described below.

FIG. 1A illustrates a front perspective view of the portable electronic device 100. In some embodiments, the portable electronic device 100 includes an enclosure 102 that defines a cavity for internal components. The portable electronic device 100 may further include a display assembly 104 (shown as a dotted line) that overlays a majority of the cavity. The display assembly 104 may include a capacitive detection unit and/or a force detection unit, each of which is capable of detecting an input to a protective cover 106 and presenting a corresponding graphical output at the display assembly 104. The protective cover 106 may be formed from a transparent material, such as glass, plastic, sapphire, or the like. The protective cover 106 may prevent surface abrasions and scratches from damaging the display assembly 104. In some embodiments, the display assembly 104 is overlaid by the protective cover 106. The portable electronic device 100 further includes a trim structure 108 that may be joined to the enclosure 102 with an attachment feature, such as an adhesive, a weld, and the like.

The enclosure 102 (also referred to as a housing) may include walls that define a cavity (not illustrated in FIG. 1A), where one or more operational components are carried within the cavity. The enclosure 102 may include a top wall 112a, a bottom wall 112b, a sidewall 112c, and a sidewall 112d. In some embodiments, the top wall 112a may be electrically isolated from the sidewall 112c and the sidewall 112d by a dielectric material 116a, and the bottom wall 112b may be electrically isolated from the sidewall 112c and the sidewall 112d by a dielectric material 116b. The dielectric material 116a and/or the dielectric material 116a can include plastic, injection-molded plastic, polyethylene terephthalate ("PET"), polyether ether ketone ("PEEK"), ceramic, and the like. It should be noted that the portable electronic device 100 may further include additional dielectric materials (not shown in FIG. 1A) integrated with the sidewall 112d.

According to some examples, at least one of the top wall 112a, the bottom wall 112b the sidewall 112c, or the sidewall 112d is formed of a non-metal material (or materials). According to some exemplary embodiments, the non-metal material includes glass, plastic, ceramic, and the like. Beneficially, the use of non-metal material(s) can reduce the amount of electromagnetic interference ("EMI") associated with the enclosure 102 and a wireless transceiver that is carried within the cavity defined by the enclosure 102. Additionally, the use of non-metal material reduces the amount of parasitic capacitance between any metal support structures that are carried within the cavity defined by the enclosure 102. Additionally, the non-metal material facilitates electromagnetic waves and radio-frequency ("RF") signals to pass through the enclosure 102.

According to some embodiments, the display assembly 104 includes a notch 116 disposed along the top wall 112a. The notch 116 is defined by a cut-out in the display assembly 104. The notch 116 carries one or more electronic components 118 (e.g., infrared detector, front-facing camera, etc.). In some examples, the one or more electronic components 118 may be utilized for facial recognition.

In some embodiments, the portable electronic device 100 includes a switch 122 and a button 124 located along the sidewall 112c and the sidewall 112d, respectively. The portable electronic device 100 further includes dock connector 126 that is capable of providing data signals and/or electrical current from an external source (not shown in FIG. 1A) to the portable electronic device 100. In some examples, the dock connector 126 refers to a bus and power connector. The dock connector 126 may be electrically coupled to a dock flex cable (not shown in FIG. 1A) that is capable of directly transmitting electrical signals and electrical current from an external source to the distributed auxiliary hub without first passing through the main logic board, as will be described herein.

FIG. 1B illustrates a rear perspective view of the portable electronic device 100 shown in FIG. 1A, in accordance with some embodiments. FIG. 1B illustrates a functional component assembly 128 is carried at least in part by a protruding trim structure 136. The functional component assembly 128 is disposed in proximity to a corner 132 of the enclosure 102. As illustrated in FIG. 1B, the functional component assembly 128 includes a camera system having dual lenses (e.g., wide and a telephoto lenses, etc.). Also, the phrase "in proximity" may refer to the functional component assembly 128 separated by distance of less than about 50 mm from the corner 132. Additionally, the functional component assembly 128 may include a flash module. The portable electronic device 100 further includes a bottom wall 134 and a protruding trim structure 136 that is secured to the bottom wall 134. In some embodiments, the bottom wall 134 is joined to the top wall 112a, the bottom wall 112b the sidewall 112c, and the sidewall 112d by an adhesive or welding (as non-limiting examples). In some examples, the bottom wall 134 is formed of a non-metal material such as glass. The portable electronic device may further include inductive charging coils 140 used for wireless charging of an internal power supply (not shown in FIG. 1B). The inductive charging coils 140 may include magnetic cores that include ferrites. In this manner, the non-metal material of the bottom wall 134 permits a magnetic field to pass through the enclosure 102 in order to induce an electrical current through the inductive charging coils 140.

Figure 2:
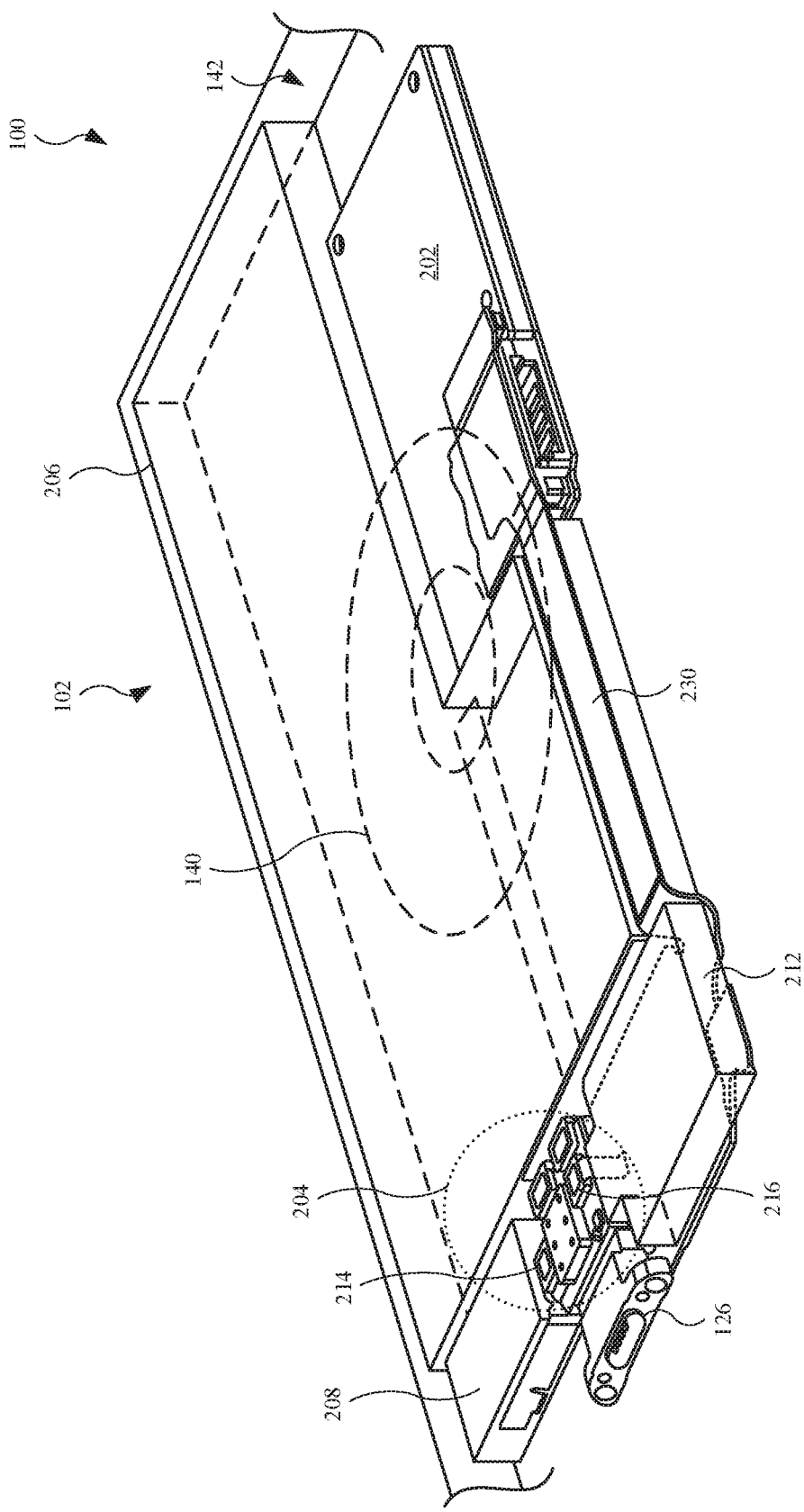
FIG. 2 illustrates a perspective view of a portable electronic device having a distributed auxiliary hub, in accordance with some embodiments.

FIG. 2 illustrates a perspective view of the portable electronic device 100, in accordance with some embodiments. For purposes of illustration, the perspective view is representative of the portable electronic device 100 without the display assembly 104 and the protective cover 106 so as to reveal internal operational components carried within a cavity 142 by the enclosure 102.

The portable electronic device 100 includes a main logic board 202 and a distributed auxiliary hub 204. The dotted circle encompasses the distributed auxiliary hub 204. The main logic board 202, or motherboard, refers to the main printed circuit board that includes the central processing unit (CPU), memory (e.g., non-volatile memory device), a system clock, a subscriber identity module (SIM) reader, and connectors for communication with user input devices. For example, the main logic board 202 can be electrically coupled to a functional component(s) (e.g., camera, facial recognition scanner, etc.). The main logic board 202 may include an integrated circuitry for controlling a majority of the functions of the portable electronic device.

The distributed auxiliary hub 204 may refer to a secondary logic board (or boards) that is separated from the main logic board 202. For instance, the distributed auxiliary hub 204 is structurally separated from the main logic board 202 by an internal power supply 206 (e.g., a battery). While FIG. 2 illustrates that the main logic board 202 is positioned at one region (e.g., an upper region of the portable electronic device 100), the distributed auxiliary hub 204 is positioned at a different region (e.g., a lower region of the portable electronic device 100). Based on the position, the distributed auxiliary hub 204 proximate, and electrically coupled, to the dock connector 126. Beneficially, positioning the distributed auxiliary hub 204 closer to the dock connector 126 will significantly shorten the signal path between the dock connector 126 and the distributed auxiliary hub 204, and therefore, increase the efficiency by which electrical current from an external source (not shown in FIG. 2) that is connected (electrically and mechanically) to the dock connector 126 is received by the distributed auxiliary hub 204. For example, the shortened signal path corresponds to a shorter flexible cable, which can reduce noise and signal losses through the flexible cable. According to some embodiments, the distributed auxiliary hub 204 is directly connected to the dock connector 126. Thus, any electrical signals received from the dock connector 126 will pass directly to the distributed auxiliary hub 204, and not through any flexible connectors or other wires.

According to some embodiments, charging circuity (not labeled in FIG. 2), or at least some of the charging circuitry, is located on the distributed auxiliary hub 204 rather than the main logic board 202. In this regard, the distributed auxiliary hub 204 is directly connected to the internal power supply 206 and the inductive charging coils 140. In some embodiments, electromagnetic fields through passing through the portable electronic device 100 induce an electrical current through the inductive charging coils 140, and the electrical current is transmitted from the inductive charging coils 140 directly to the distributed auxiliary hub 204. Thereafter, the distributed auxiliary hub 204 transmits the electrical current to charge the internal power supply 206 and/or power to the main logic board 202. Beneficially, transmitting the electrical current directly between the inductive charging coils 140 and the distributed auxiliary hub 204 increases charging efficiency by shortening overall resistance/impedance (measured in Ohms, $\Omega$), or opposition to the electrical current. In some embodiments, power in the form of electrical current running through the dock connector 126 is directly received by the distributed auxiliary hub 204. Thereafter, the distributed auxiliary hub 204 transmits the electrical current to the internal power supply 206 and/or the main logic board 202.

The distributed auxiliary hub 204 may include dedicated integrated circuits for controlling one or more electronic components carried by the portable electronic device 100. The "dedicated" refers to the functions of these integrated circuits operable by the distributed auxiliary hub 204. In other words, the functions of these dedicated integrated circuits are not duplicated by another integrated circuit(s) of the main logic board 202. According to some examples, the distributed auxiliary hub 204 is positioned adjacent to a haptic feedback module 208 and an acoustic speaker module 212. The haptic feedback module 208 is capable of eliciting haptic feedback and the acoustic speaker module 212 is capable of eliciting sound or acoustic feedback in response to requests provided by the distributed auxiliary hub 204. As the haptic feedback module 208 and the acoustic speaker module 212 are positioned adjacent to the distributed auxiliary hub 204, it is more beneficial to provide the distributed auxiliary hub 204 with a dedicated integrated circuit to operate these modules, as opposed to operating the haptic feedback module 208 and the acoustic speaker module with integrated circuits located on the main logic board 202. Accordingly, the distributed auxiliary hub 204 includes a haptic feedback circuit 214 that is capable of transmitting electrical signals directly from the distributed auxiliary hub 204 to the haptic feedback module 208 without first requiring the electrical signals to pass through the main logic board 202. Similarly, the distributed auxiliary hub 204 includes an acoustic speaker circuit 216 that is capable of transmitting electrical signals directly from the distributed auxiliary hub 204 to the acoustic speaker module 212 without first requiring the electrical signals to pass through the main logic board 202. As an example, the electrical signals provided by the haptic feedback circuit 214 and the acoustic speaker circuit 216 may include control signals to the haptic feedback module 208 and the acoustic speaker module 212, respectively. Beneficially, relative to conventional electronic devices, the haptic feedback circuit 214 and the acoustic speaker circuit 216 are located closer to the haptic feedback module 208 and the acoustic speaker module 212, respectively, thereby reducing the length of the signal path to reach these modules and increasing their functional efficiency.

According to some embodiments, the distributed auxiliary hub 204 is carried by and electrically coupled to a dock flex 230. The dock flex 230 may include a flexible circuit. The dock flex 230 is electrically coupled to the main logic board 202, where the main logic board 202 includes a connector having pins (e.g., a single row of pins). In contrast to coaxial cable connectors, the dock flex 230 is a cable capable of utilizing the dock connector 126 to transmit and/or receive multiple different data signals from the main logic board 202. The dock flex 230 may include a conductive element such as a surface-mounted technology ("SMT") pad that enables electrical conductivity between the dock flex 230 and the distributed auxiliary hub 204. For example, the distributed auxiliary hub 204 may receive electrical signals from at least one of the dock connector 126 or the inductive charging coils 140, and in turn, the distributed auxiliary hub 204 can transmit the electrical signals to the main logic board 202.

Figure 3:
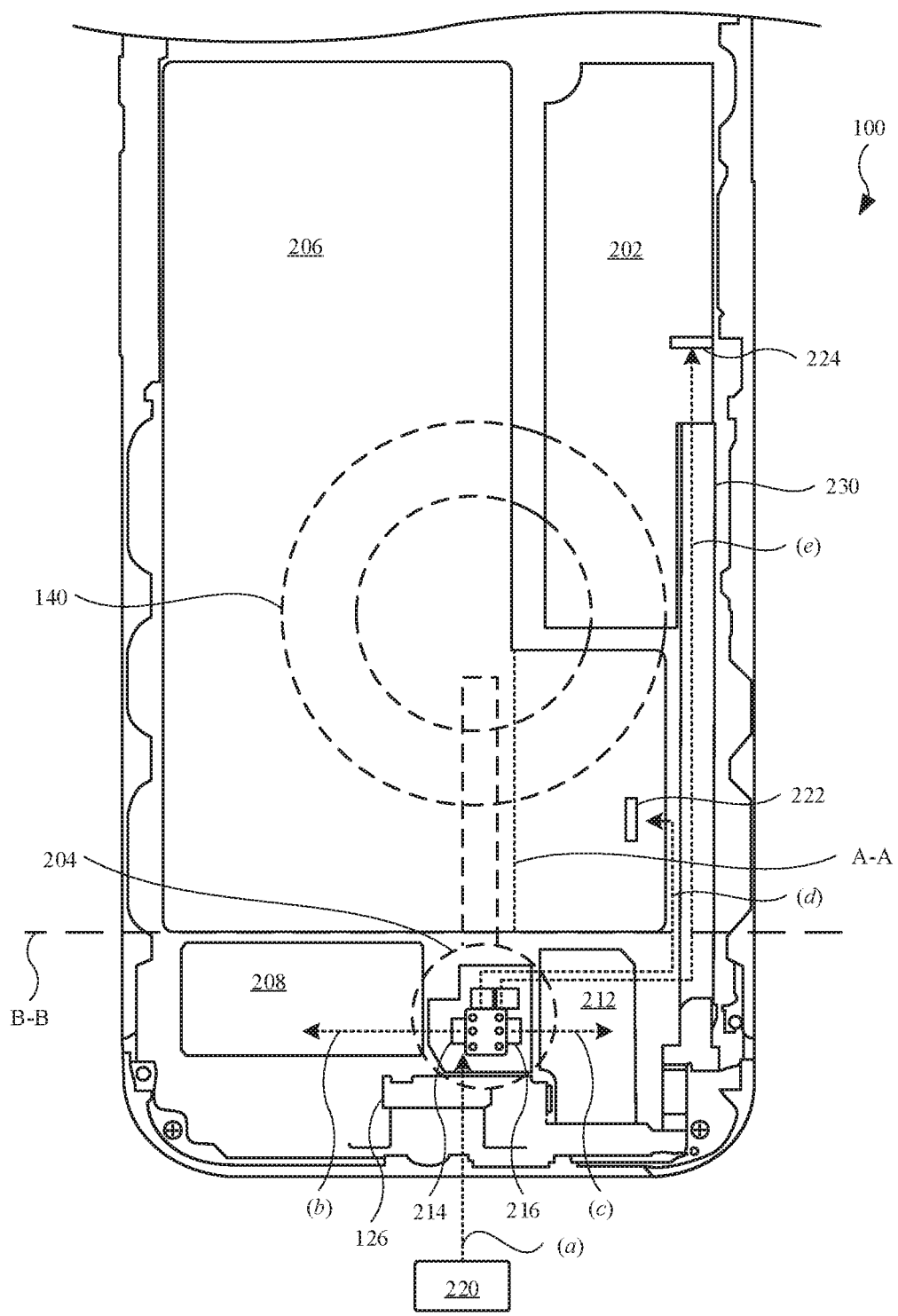
FIG. 3 illustrates a top view of a portable electronic device having a distributed auxiliary hub, in accordance with some embodiments.

FIG. 3 illustrates a top view of the portable electronic device 100, in accordance with some embodiments. For purposes of illustration, the perspective view is representative of the portable electronic device 100 without the display assembly 104 and the protective cover 106 so as to reveal internal operational components carried within a cavity 142 by the enclosure 102. An exemplary diagram of a distribution of electrical signals to various destinations (e.g., the main logic board 202, the internal power supply 206, etc.) by the distributed auxiliary hub 204 when the distributed auxiliary hub 204 is electrically connected to an external source 220 is shown.

As defined herein, the distributed auxiliary hub 204 is capable of distributing electrical signals according to multiple different electrical paths to reach different destinations. However, when the distributed auxiliary hub 204 is not electrically coupled to the external resource or not receiving electrical current, then the main logic board 202 may be responsible for drawing electrical current from the internal power supply 206 in order to execute various functions. Further, in some embodiments, the main logic board 202 may be responsible for executing a majority or generally all functions of the portable electronic device 100 when the portable electronic device 100 is not receiving power from the external resource or the inductive charging coils 140.

Further, the external source 220 is electrically coupled to the dock connector 126. In some embodiments, the external source 220 includes an external cable that is received by electrical pins or contacts of the dock connector 126. In some examples, the external source 220 is a power supply unit or a (separate) portable electronic device that is capable of transmitting electrical signals to the portable electronic device 100 via the dock connector 126. In some examples, the electrical signals include an electrical current that is sufficient for charging the internal power supply 206 and providing power to the distributed auxiliary hub 204 and/or the main logic board 202. In turn, the dock connector 126 is capable of directly transmitting the electrical signals to the distributed auxiliary hub 204 without the need to first route the electrical signals through the main logic board 202. The electrical signals pass from the dock connector 126 to the distributed auxiliary hub 204 via electrical path (a).

Once the distributed auxiliary hub 204 receives the electrical signals, the distributed auxiliary hub 204 may determine where to distribute the electrical signals based on at least one of the nature of the electrical signals or the needs of the portable electronic device 100. In some embodiments, the distributed auxiliary hub 204 may receive instructions that cause the haptic feedback circuit 214 (located on the distributed auxiliary hub 204) to transmit the electrical signals directly to the haptic feedback module 208 in order to generate haptic feedback. In some examples, the distributed auxiliary hub 204 may receive the instructions to generate haptic feedback from the main logic board 202. The electrical signals can travel between the distributed auxiliary hub 204 and the haptic feedback module 208 via electrical path (b). In some embodiments, the distributed auxiliary hub 204 may receive instructions (e.g., from the main logic board 202) to execute acoustic feedback. Accordingly, when the distributed auxiliary hub 204 receives the electrical signals, the acoustic speaker circuit 216 (located on the distributed auxiliary hub 204) may directly transmit the electrical signals to the acoustic speaker module 212 via electrical path (c).

The haptic feedback module 208 and the acoustic speaker module 212 are both located at one region of the portable electronic device 100 (i.e., below the internal power supply 206). By enabling the distributed auxiliary hub 204 to directly transmit electrical signals to these modules without first routing through the main logic board 202, the electrical current path to provide power for these modules is significantly reduced relative to conventional portable electronic devices. As a result, an increased charging efficiency may occur, as energy losses (for example, electrical energy converted to thermal energy) are reduced.

According to some embodiments, the distributed auxiliary hub 204 is directly connected to the internal power supply 206. Electrical signals received by the distributed auxiliary hub 204 may be transmitted to the internal power supply 206, by way of the dock flex 230, without first routing to the main logic board 202. The internal power supply 206 includes a battery connector 222 that is capable of receiving electrical signals directly from the distributed auxiliary hub 204 via electrical path (d). In some examples, the battery connector 222 is a double-headed connector capable of receiving the electrical signals from the distributed auxiliary hub 204. In some embodiments, the internal power supply 206 is capable of utilizing the double-headed connector to transmit electrical signals from the internal power supply 206 directly to the main logic board 202. For example, when the portable electronic device 100 is not electrically connected to and drawing power from the external source 220, the main logic board 202 may instead draw power from the internal power supply 206. Beneficially, the double-headed connector permits distribution of electrical signals much closer to their final destination by permitting transmission of the electrical signals in multiple directions. In contrast, conventional portable electronic devices may include a power supply unit with a single-headed connector that does not permit for multi-direction distribution of electrical signals.

According to some embodiments, the distributed auxiliary hub 204 is capable of transmitting electrical signals to the main logic board 202 via the dock flex 230. As will be described herein, the distributed auxiliary hub 204 is electrically connected to the dock flex 230 via an SMT contact. Electrical signals from the distributed auxiliary hub 204 that originated from the external source 220 may be transmitted to the main logic board 202 via the dock flex 230 as illustrated by electrical path (f). The main logic board 202 includes a logic board connector 224 having pins that is connected to the dock flex 230.

According to some embodiments, the distributed auxiliary hub 204 is capable of directing the electrical signals that are received from the dock connector 126 to the internal power supply 206 and the main logic board 202. In some embodiments, the distributed auxiliary hub 204 is a passive circuit. As described herein, when the distributed auxiliary hub 204 is a passive circuit, the distributed auxiliary hub 204 relies upon instructions from the main logic board 202 to direct electrical signals to either the internal power supply 206 and/or the main logic board 202. Also, the distributed auxiliary hub 204 is directly connected to the inductive charging coils 140 and is capable of transmitting electrical current received from the inductive charging coils 140 to the main logic board 202 via the dock flex 230.

Unlike conventional portable electronic devices, the main logic board 202 does not include integrated circuit(s) for the charging components, such as charging for the internal power supply 206 and the inductive charging coils 140. Beneficially, moving these integrated circuit(s) off the main logic board 202 significantly reduces the footprint of the main logic board 202. As a result of the reduced area of the main logic board 202, the internal power supply 206 can adopt different shapes and geometries besides the conventional rectangular shapes, thereby increasing the size of the internal power supply 206, which allows for additional power storage (measured in milliamp-hours). For example, the line A-A represents a maximum limit of a conventional battery fitted within the portable electronic device 100 without separating the distributed auxiliary hub 204 from the main logic board 202. As illustrated in FIG. 3, the internal power supply 206 has an irregular shape (e.g., L-shape) due to extending beyond the line A-A, which is made possible by implementing the distributed auxiliary hub 204. As defined herein, the phrase "irregular shape" refers to a non-quadrilateral shape. Moreover, positioning the distributed auxiliary hub 204 below the internal power supply 206 enables the portable electronic device 100 to maximize previously unoccupied space between the haptic feedback module 208 and the acoustic speaker module 212. It should be noted that the size of the internal power supply 206 cannot extend any further than the line B-B due to limitations of the display assembly 104.

FIGS. 4A-4E illustrate various views of a distributed auxiliary hub 204 in accordance with some embodiments. The distributed auxiliary hub 204 may define a circuit assembly or a stacked logic board, as the distributed auxiliary hub 204 may include at least two circuit boards, with one circuit board stacked over another circuit board. The distributed auxiliary hub 204 is designed to carry and support the distributed auxiliary hub 204. Although not shown in FIGS. 4A-4E, the distributed auxiliary hub 204 can be integrated into a portable electronic device, such as the portable electronic device 100 (shown in FIGS. 1A-3). By incorporating the distributed auxiliary hub 204 with the distributed auxiliary hub 204, the size of the internal power supply 206 can increase beyond the line A-A (see FIG. 3), creating greater energy storage capacity.

Figure 4A:
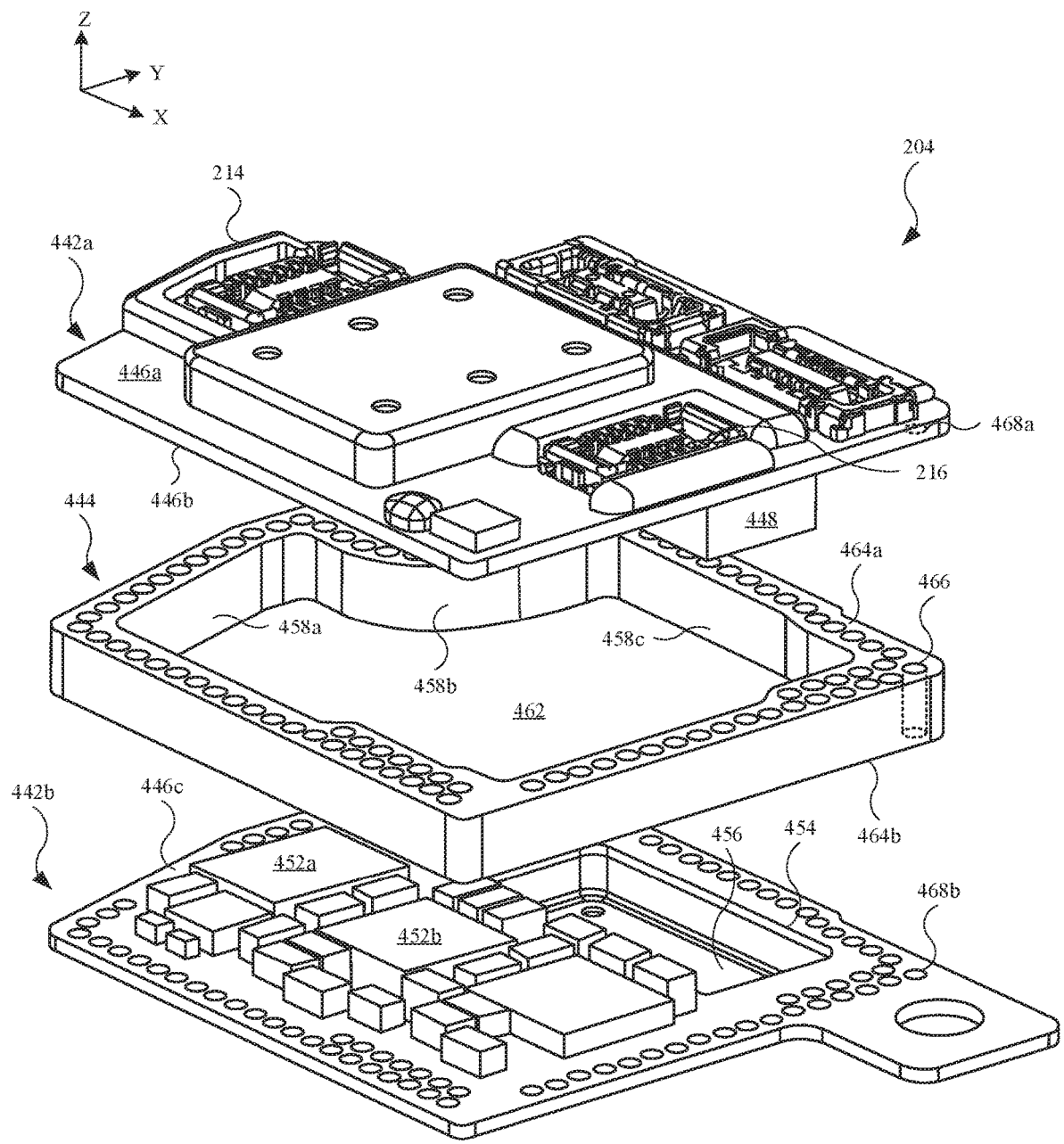
FIGS. 4A-4E illustrate various views of a circuit assembly having a distributed auxiliary hub, in accordance with some embodiments.

FIG. 4A illustrates an exploded view of the distributed auxiliary hub 204 in an unassembled configuration. As shown, the distributed auxiliary hub 204 may include a circuit board 442a and a circuit board 442b, each of which may include a printed circuit board. The circuit board 442a and a circuit board 442b may be referred to as a first circuit board and a second circuit board, respectively. The distributed auxiliary hub 204 may further include an interposer board 444 positioned between the circuit board 442a and the circuit board 442b.

The circuit board 442a and the circuit board 442b may each include a printed circuit board (e.g., FR4 material, etc.) having a generally rigid, inflexible design, as opposed to a flexible circuit. The circuit board 442a may include a mounting surface 446a that carries one or more electronic components of the distributed auxiliary hub 204, including the haptic feedback circuit 214 and the acoustic speaker circuit 216. Additionally, the circuit board 442a may also include, as non-limiting examples, various electronic components, including a processor, memory, capacitor, resistor, transistor, inductor, diode, battery, switches, connectors and/or other suitable components. The distributed auxiliary hub 204 is designed to provide communication and controls to modules and components of the portable electronic device 100 (shown in FIGS. 1A-3) in a more efficient manner. For example, when the distributed auxiliary hub 204 is assembled, the haptic feedback circuit 214 and the acoustic speaker circuit 216 are capable of transmitting electrical signals directly from the distributed auxiliary hub 204 to the haptic feedback module 208 and the acoustic speaker module 212 (shown in FIGS. 2 and 3), respectively, without first requiring the electrical signals to pass through the main logic board 202 (shown in FIGS. 2 and 3).

Electronic components can be mounted to an additional surface of the circuit board 442a. For example, circuit board 442a may include a mounting surface 446b (opposite the mounting surface 446a). As shown, an inductor 448 is located on the mounting surface 446b. Although not specifically illustrated in FIG. 4A, each of the mounting surface 446a and the mounting surface 446b includes electrical contacts or pins that enable the circuit board 442a to electrically communicate with the circuit board 442b when the distributed auxiliary hub 204 is assembled. Although the distributed auxiliary hub 204 includes two circuit boards and a single interposer board, as illustrated in FIG. 4A, it should be noted that any number of circuit boards may be separated by any number of interposer boards. For example, in some embodiments (not shown), a circuit assembly includes three circuit boards, where the first and second circuit boards are separated by a first interposer board, and the second and third circuit boards are separated by a second interposer board.

The circuit board 442b may include a mounting surface 446c that carries one or more electronic components, such as a dedicated processor 452a for the haptic feedback circuit 214 and a dedicated processor 452b for the acoustic speaker circuit 216. Accordingly, the dedicated processor 452a and the dedicated processor 452b may be electrically connected to the haptic feedback circuit 214 and the acoustic speaker circuit 216, respectively. Additionally, the circuit board 442b may also include, as non-limiting examples, various electronic components such as a processor, memory, capacitor, resistor, transistor, inductor, diode, battery, switches, connectors and/or other suitable components. Additionally, the circuit board 442b may include an opening 454, or aperture, that permits for the inductor 448 to pass through the circuit board 442b when the distributed auxiliary hub 204 is assembled. The circuit board 442b further includes a shield 456 that is aligned with the opening 454. The shield 456 may provide an electromagnetic shield for the inductor 448.

In some embodiments, the interposer board 444 includes an elongated shape. In this regard, the interposer board 444 may include a mounting region 458a, a mounting region 458b, and a mounting region 458c. The mounting region 458a, the mounting region 458b, and the mounting region 458c may combine to define a cavity 462, with the cavity 462 defining a space (or void) in the interposer board 444. In this manner, when the distributed auxiliary hub 204 is assembled, the inductor 448 is positioned in, or at least partially positioned in, the cavity 462. The interposer board 444 may be formed of a combination of an electrically conductive layer and an electrically insulating layer. The electrically insulating layer may include multiple through holes filled with conductive pins that are formed of an electrically conductive material, such as copper. In particular, the electrically conductive layer and the electrically insulating layer may be formed of flexible materials so that the interposer board 444 may be bent into different shapes to accommodate to contours of the circuit board 442a and the circuit board 442b. Also, in some embodiments, the interposer board 444 does not include a castellation feature.

The interposer board 444 may include a mounting surface 464a and a mounting surface 464b, which may also be referred to as a first mounting surface and a second mounting surface, respectively. When the distributed auxiliary hub 204 is assembled, the mounting surface 464a and the mounting surface 464b are mounted to the mounting surface 446b (of the circuit board 442a) and the mounting surface 446c (of the circuit board 442b), respectively. When the interposer board 444 is mounted to the circuit board 442a and the circuit board 442b, the interposer board 444 can enclose at least some the electronic components carried by the circuit board 442a and the circuit board 442b. Beneficially, when enclosed, the electrically conductive layer of the interposer board 444 functions as an electromagnetic shield that protects the electronic components on the circuit board 442a and the circuit board 442b from EMI. Additionally, since the electrically conductive layer is in electrical contact with the circuit board 442a and the circuit board 442b, the electrically conductive layer may function as a common ground for the circuit board 442a and the circuit board 442b.

Further, the interposer board 444 includes a conductive pin 466 (representative of at least some of the remaining conductive pins of the interposer board 444 shown in FIG. 4A, each of which includes a generally circular surface). The conductive pin 466 includes an electrically conductive pin that extends at least to the mounting surface 464a and the mounting surface 464b. The mounting surface 446b of the circuit board 442a includes an electrical contact 468a (shown as a dotted line) designed to electrically connects to the conductive pin 466. Further, the mounting surface 446c of the circuit board 442b includes an electrical contact 468b designed to electrically connects to the conductive pin 466. When the distributed auxiliary hub 204 is assembled, the conductive pin 466 is electrically connected to the electrical contact 468a (of the circuit board 442a) and the electrical contact 468b (of the circuit board 442b). As a result, the conductive pin 466 can transmit signals between the circuit board 442a and the circuit board 442b, thereby placing the circuit board 442a in electrical communication with the circuit board 442b. It should be noted that the resultant electrical communication places the electrical components located on the circuit board 442a in electrical communication with electrical components located on the circuit board 442a. Although not specifically shown and labeled, each of the circuit board 442a and the circuit board 442b includes multiple electrical contacts, and the interposer board 444 includes multiple conductive pins. These electrical contacts of the circuit board 442a and the circuit board 442b are designed and positioned to electrically connect to a conductive pin of the interposer board 444, thereby providing additional electrical communication paths between the circuit board 442a to the circuit board 442b. Also, each of the conductive pins of the interposer board 444 may be separated and isolated from each other by the insulating layer of the interposer board 444 so that each of the conductive pins of the interposer board 444 serves as an individual electrical communication pathway.

Figure 4B:
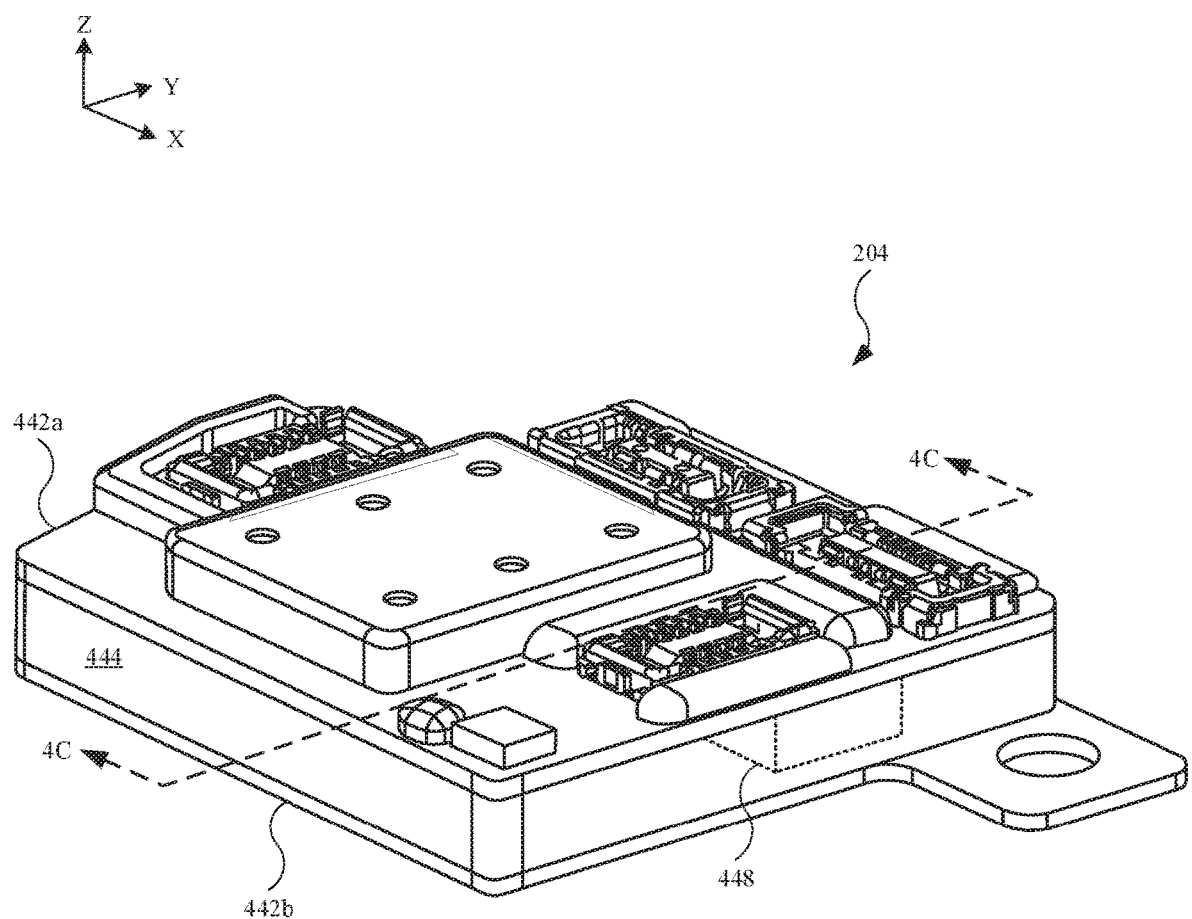

FIG. 4B illustrates a perspective view of the distributed auxiliary hub 204, showing the distributed auxiliary hub 204 assembled and in a stacked configuration. As illustrated, the stacked configuration of the distributed auxiliary hub 204 illustrates the circuit board 442a and the circuit board 442b mounted to opposing surfaces of the interposer board 444. Further, the stacked configuration shows interposer board 444 overlaying the circuit board 442b, and the circuit board 442a overlaying both the interposer board 444 and the circuit board 442b. The stacked architecture of the distributed auxiliary hub 204 positions multiple circuit boards (i.e., the circuit board 442a and the circuit board 442b) within a single footprint area (as opposed to a single circuit board that occupies additional space along the X- and Y-axes, thereby maximizing the amount of available space within a portable electronic device (an in particular, the cavity 142 of the portable electronic device shown in FIG. 2). In other words, stacking multiple circuit boards within the distributed auxiliary hub 204 enables for more electronic components to be carried in a single footprint area along an X-Y plane.

Figure 4C:
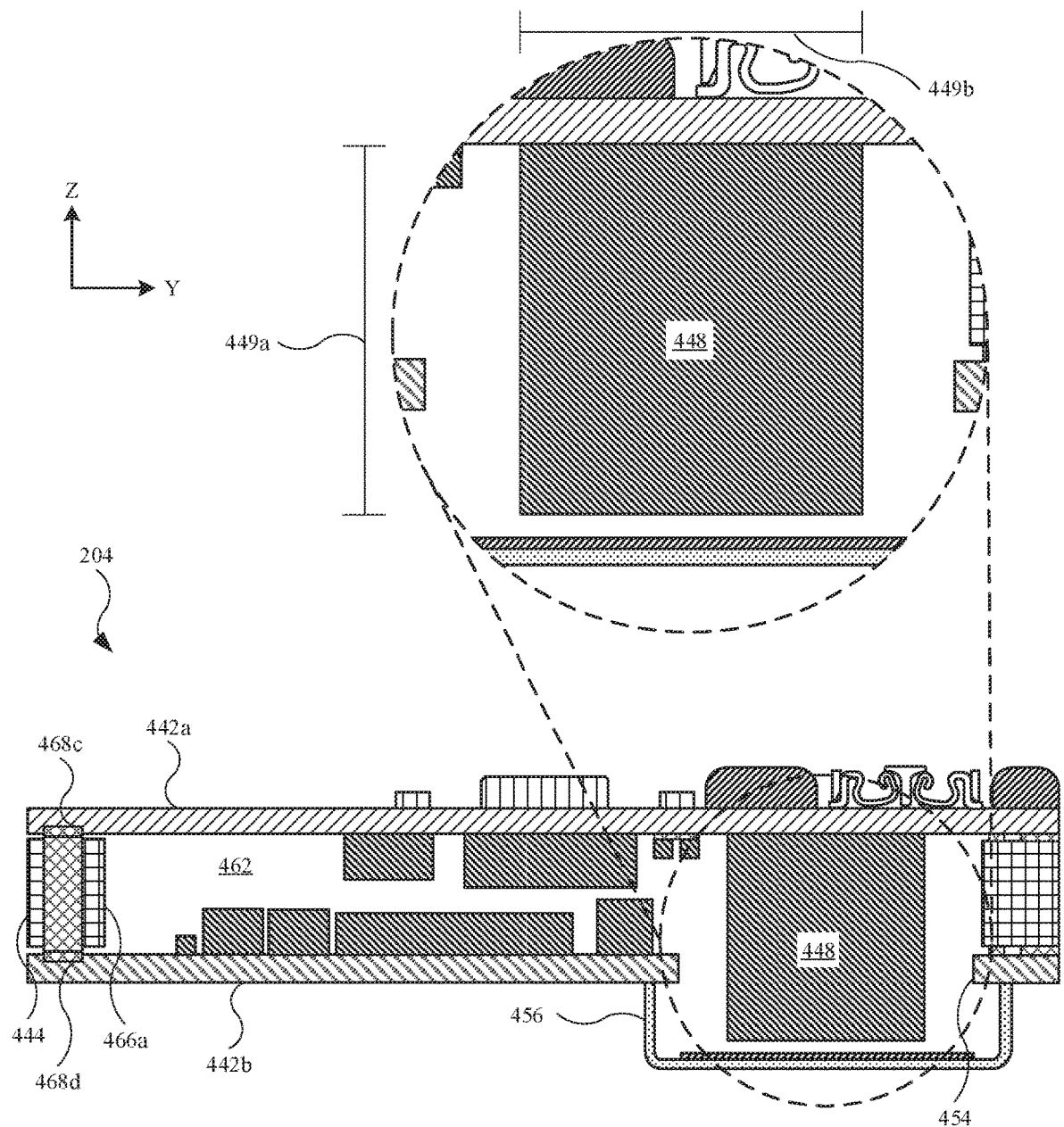

FIG. 4C illustrates a cross-sectional view of the distributed auxiliary hub 204, taken along the reference line 4C-4C in FIG. 4B. As shown, the interposer board 444 includes a conductive pin 466a that spans through the interposer board 444 and electrically connects to an electrical contact 468c and an electrical contact 468d of the circuit board 442a and circuit board 442b, respectively, thereby enabling communication between the circuit board 442a and circuit board 442b. Also, the shield 456 covers, or at least substantially covers, the inductor 448 and thus. The shield 456 may include a metal (or metals), and as a result, the shield 456 can shield the inductor 448 from EMI. Based on the arrangement, the interposer board 444 not only physically prevents external objects from entering into the cavity 462, but also provides electromagnetic shielding of electronic components disposed within the cavity 462, such as the inductor 448.

The inductor 448 may be 4 to 6 times the size of a conventional inductor for a portable electronic device. In some embodiments, the inductor 448 is a relatively tall inductor with a high aspect ratio. For example, as shown in the enlarged view, a dimension 449a, or height, of the inductor 448 (measured along the Z-axis) that is greater than a dimension 449b, or width, of the inductor 448 (measured along the Y-axis). The dimension 449a is parallel, or at least substantially parallel, with respect to the circuit board 442a, and the dimension 449b is perpendicular, or at least substantially perpendicular, with respect to the circuit board 442a. The high aspect ratio is approximately in the range of 2:1 to 6:1. In other words, the height of the inductor 448 is approximately 2 to 6 times greater than the width. Beneficially, utilizing a relatively larger inductor (e.g., between 0.4 to 1.0 microhenries) promote faster (i.e., shorter) charging times for an internal power supply, including relatively larger internal power supplies (such as the internal power supply 206 shown in FIGS. 2 and 3) that include an L-shaped internal power supply. In some instances, the inductor 448 can enable an internal power supply to reach a 50% charged state (from a completely drained stated) within 30 minutes of charging. Moreover, the inductor 448, having a relatively larger size, can significantly reduce heat generation during a charging event of an internal power supply, which effectively reduces the carbon footprint associated with charging a portable electronic device.

It should be noted that while the inductor 448 includes the high aspect ratio, the opening 454 within the substrate of the circuit board 442b is sufficiently large enough to accommodate the inductor 448, and the shield 456 is sufficiently large enough to cover the inductor 448. It should also be noted that other electronic components (e.g., capacitor, battery, etc.) may also pass through the opening 454 so as to incorporate additional, larger electronic components than otherwise possible without the opening 454. Also, although not shown, the substrate of the circuit board 442b may include additional openings through which one or more electronic components pass.

Figure 4D:
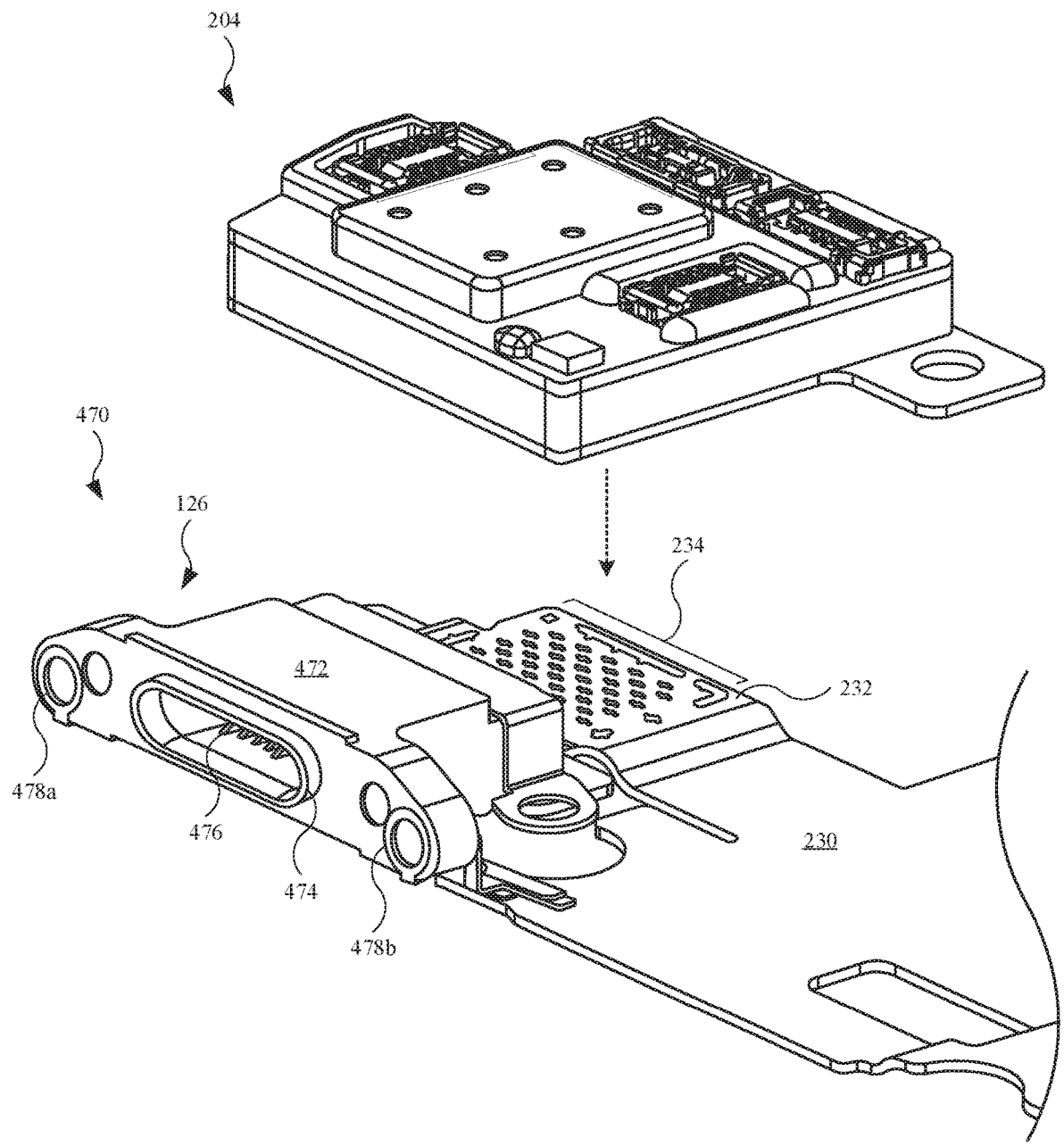

FIG. 4D illustrates an exploded view of the distributed auxiliary hub 204 and a dock assembly 470 in an unassembled configuration, in accordance with some embodiments. As shown, the dock connector 126 and the dock flex 230 are integrated with the dock assembly 470, with the dock connector 126 mounted onto the dock flex 230. The dock connector 126 may include a dock connector housing 472 that includes a dock connector opening 474 where electrical pins 476 are located. The electrical pins 476 are capable of electrically connecting with a corresponding electrical connector of an external source (such as the external source 220 shown in FIG. 3). Accordingly, when an external source is coupled to the dock connector housing 472 via the dock connector opening 474, the electrical pins 476 are capable of receiving electrical signals from the external source. Although the dock connector 126 is mounted onto and/or adjacent to the dock flex 230, when the distributed auxiliary hub 204 is electrically coupled to the dock assembly 470, electrical signals received by the dock connector 126 can be directly transmitted to the distributed auxiliary hub 204, as opposed to the electrical signals first passing through the dock flex 230. Also, the dock connector 126 includes a mounting element 478a and a mounting element 478b used to secure the dock connector housing 472 to the enclosure 102 (e.g., the bottom wall 112b of the enclosure 102 shown in FIGS. 1A and 1B). As a non-limiting example, the mounting element 478a and the mounting element 478b may each include a threaded opening designed to receive a threaded fasteners.

The dock flex 230 includes a mounting surface 232 capable of carrying the distributed auxiliary hub 204. As shown, the mounting surface 232 includes electrical contacts 234. In some examples, the electrical contacts 234 define an SMT pad with one or more copper contacts. The distributed auxiliary hub 204 may include an electrical connector (not shown in FIG. 4D) designed to electrically couple with the electrical contacts 234. Thus, when the distributed auxiliary hub 204 is mounted onto the mounting surface 232, the electrical connector of the distributed auxiliary hub 204 electrically connects to the electrical contacts 234 of the mounting surface 232, thereby allowing transmission of electrical signals from the electronic components of the distributed auxiliary hub 204 to the dock flex 230, and vice versa. As understood by one of ordinary skill in the art, a high-temperature solder may be used to form the electrical contacts 234 onto the mounting surface 232. However, in some instances, a low-temperature should be used to secure and electrically couple the electrical connector of the distributed auxiliary hub 204 to the electrical contacts 234, as the low-temperature solder may prevent thermal damage to the electronic components of the distributed auxiliary hub 204 and/or the dock flex 230.

Additionally, mounting the distributed auxiliary hub 204 onto the electrical contacts 234 of the dock flex 230 provides the benefits of a printed circuit board and a flexible circuit. For example, the distributed auxiliary hub 204 imparts the benefits of a rigid, printed circuit board (defined by the circuit board 442a and/or the circuit board 442b), while the stacked configuration of the distributed auxiliary hub 204 enables multiple electronic components to be carried within a small placement area that is defined by the shape and size of the mounting surface 232. Additionally, mounting the distributed auxiliary hub 204 onto the dock flex 230 imparts the benefits of a flexible circuit (i.e., the dock flex 230), which include (as a non-limiting example) reducing the number of required interconnects and negating the need to design the electronic components that are carried within the portable electronic device 100 (shown in FIGS. 1A-3) around the contours of the dock flex 230.

Figure 4E:
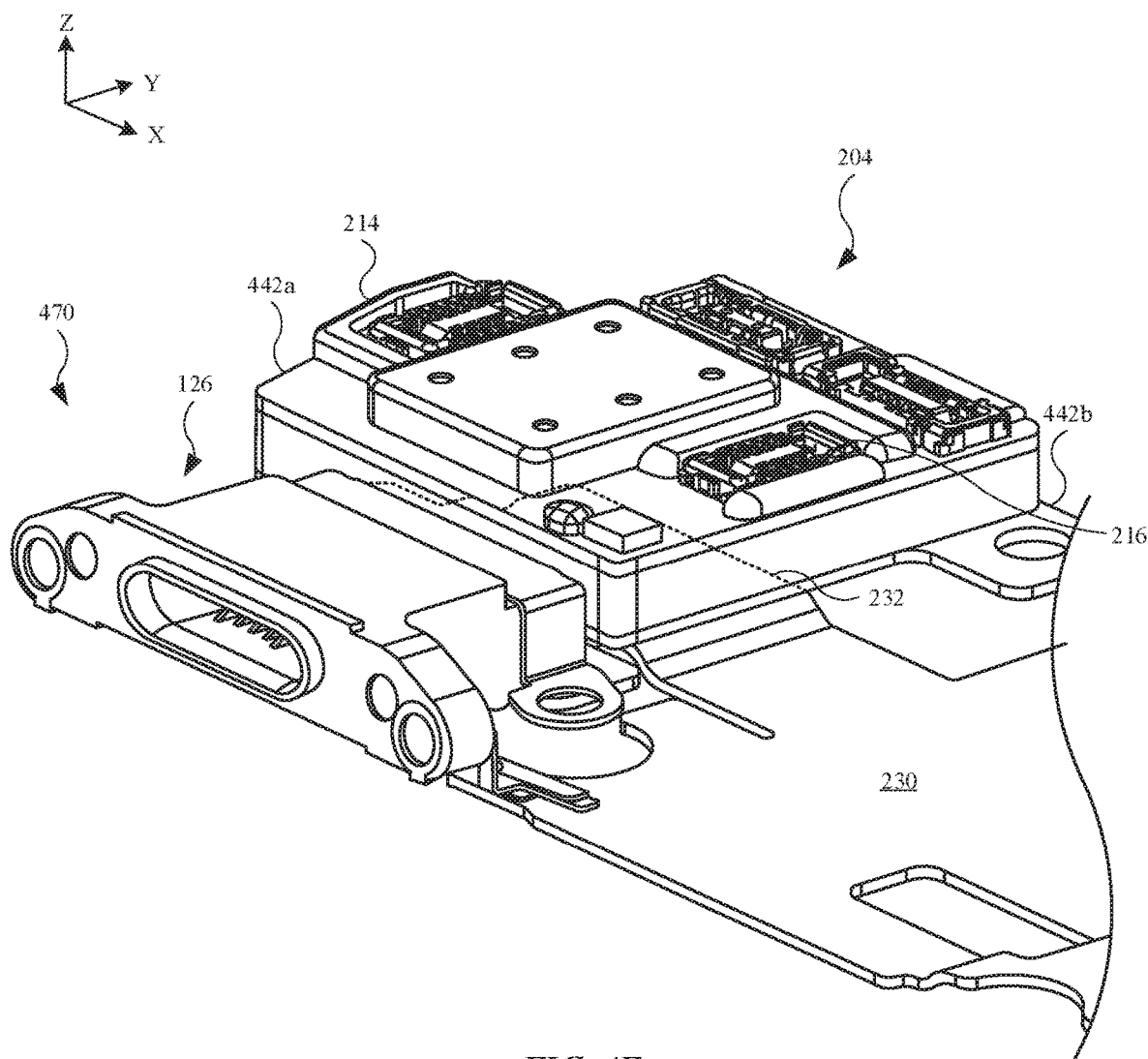

FIG. 4E illustrates a perspective view of the distributed auxiliary hub 204 and the dock assembly 470 in an assembled configuration. As shown, the distributed auxiliary hub 204 is mounted directly onto the mounting surface 232 (shown as a dotted line) of the dock flex 230. When connected to the dock connector 126 and the dock flex 230, the distributed auxiliary hub 204 is capable of distributing electrical signals received from the dock connector 126 to multiple destinations. In some embodiments, the dock connector 126 includes electrical interfaces (not shown in FIG. 4E) that are capable of connecting with the electrical connector (not shown in FIG. 4E) of the distributed auxiliary hub 204. In these embodiments, the dock connector 126 is directly connected to the distributed auxiliary hub 204 so that power and/or electrical signals from the dock connector 126 is/are directly transmitted to the distributed auxiliary hub 204.

The distributed auxiliary hub 204 may provide portable electronic devices (such as the portable electronic device 100 shown in FIGS. 1A-3) with a more efficient and effective design specification. For example, the design specification transfers circuitry, such as the haptic feedback circuit 214 and the acoustic speaker circuit 216, off of the main logic board 202 (shown in FIGS. 2 and 3) and onto the distributed auxiliary hub 204 (acting as a secondary logic unit or secondary circuit assembly). As a result, the distributed auxiliary hub 204, when incorporated into the portable electronic device 100 (shown in FIGS. 1A-3), can directly connect to the haptic feedback module 208 and the acoustic speaker module 212 by way of the haptic feedback circuit 214 and the acoustic speaker circuit 216, respectively. Further, the charging circuitry (not labeled in FIG. 4E) can also be located on the distributed auxiliary hub 204 (rather than the main logic board 202, shown in FIGS. 2 and 3), and as a result, power can run from the dock connector 126 or the inductive charging coils 140 through the charging circuitry (not labeled in FIG. 4E) on the distributed auxiliary hub 204 to the internal power supply 206 and the main logic board 202. Also, although not labeled, circuity used to communicate with the dock connector 126 can also be located on the distributed auxiliary hub 204.

The distributed auxiliary hub 204 allows the charging circuitry to be closer to the dock connector 126, which can be used to receive power from an external source (such as the external source 220 (shown in FIG. 3). Beneficially, the overall charging efficiency may increase by reducing the overall resistance generated during a charging event. Additionally, the haptic feedback module 208 and the acoustic speaker module 212 (shown in FIGS. 2 and 3) benefit from increased efficiency by moving the haptic feedback circuit 214 and the acoustic speaker circuit 216 closer to the dock connector 126 (as opposed to the aforementioned circuitry remaining on the main logic board 202 shown in FIGS. 2 and 3), and providing the haptic feedback circuit 214 and the acoustic speaker circuit 216 with a direct connection to the dock connector 126.

Figure 5A:
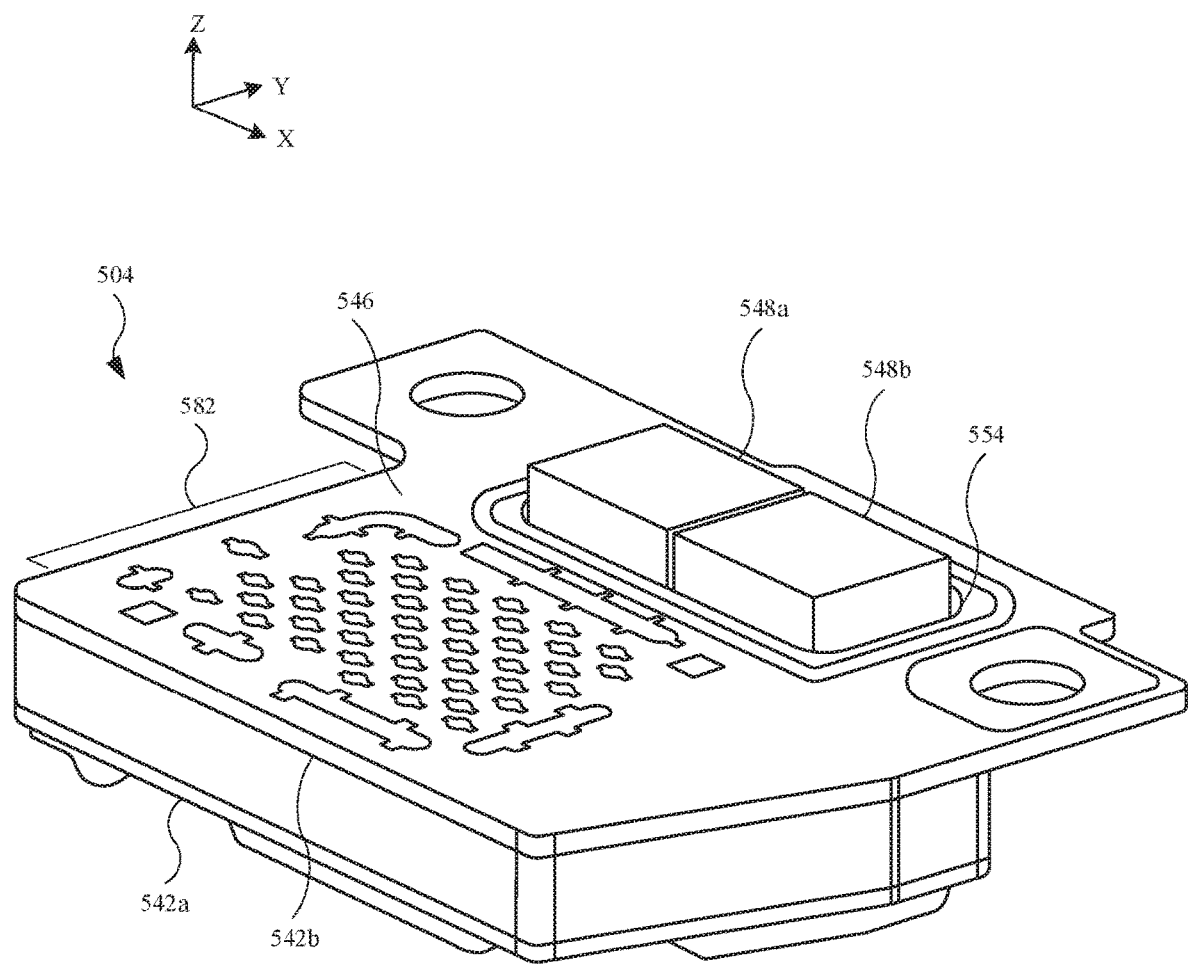
FIGS. 5A and 5B illustrate alternate embodiments of a circuit assembly, in accordance with some embodiments.
Figure 5B:
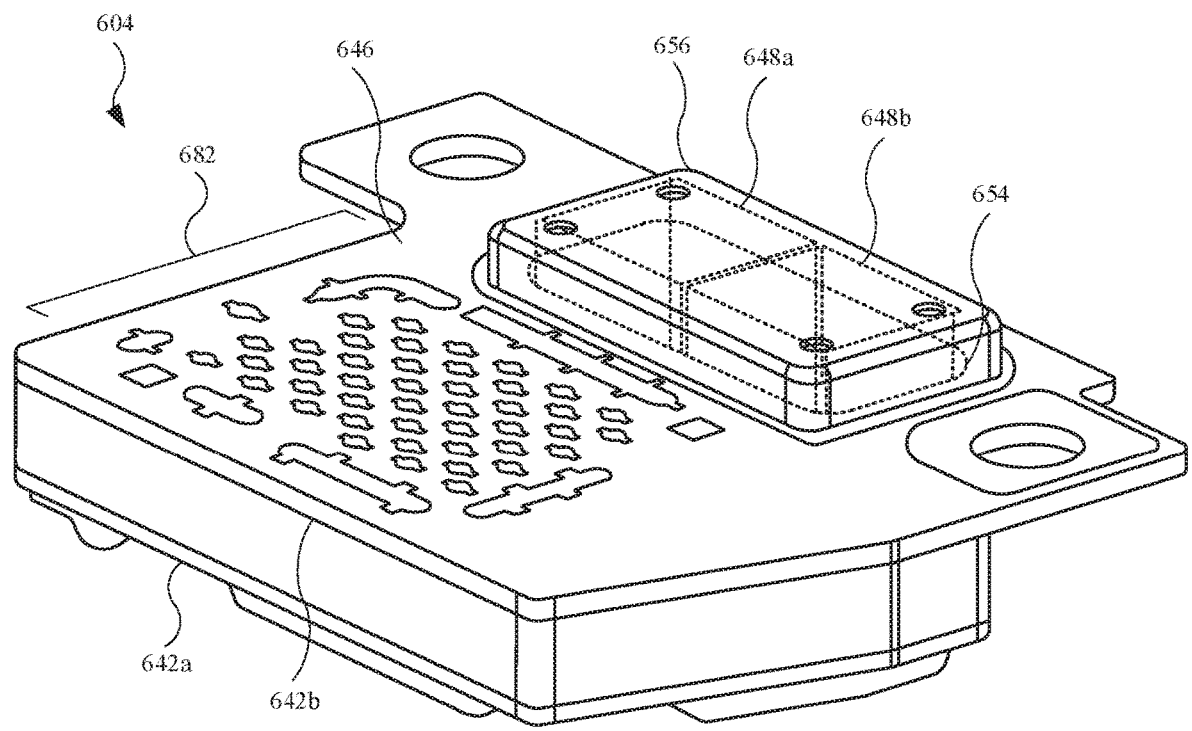

FIGS. 5A and 5B illustrate alternate embodiments of a distributed auxiliary hub in accordance with some embodiments. In particular, FIGS. 5A and 5B illustrate an inverted (i.e., upside down, or rotated about the Y-axis) view of a distributed auxiliary hub in a stacked configuration. The distributed auxiliary hubs shown and described in FIGS. 5A and 5B may include any features shown and described for the distributed auxiliary hub 204 (shown in FIGS. 4A-4E). Also, the distributed auxiliary hubs shown and described in FIGS. 5A and 5B may be integrated into portable electronic devices, such as the portable electronic device 100 (shown in FIGS. 1A-3).

FIG. 5A illustrates an inverted view of a distributed auxiliary hub 504, in accordance with some described embodiments. As shown, the distributed auxiliary hub 504 includes a circuit board 542a and a circuit board 542b. The distributed auxiliary hub 504 further includes an inductor 548a and an inductor 548b, each of which extend and pass through an opening 554 in the circuit board 542b. The inductor 548a and the inductor 548b are unshielded from EMI. The circuit board 542a includes a mounting surface 546 that carries an electrical connector 582 in the form of electrical pads. When the distributed auxiliary hub 504 is connected to a dock flex (such as the dock flex 230, shown in FIGS. 2, 3, 4D, and 4E), the electrical connector 582 is capable of electrically connecting with electrical contacts of the dock flex.

FIG. 5B illustrates an inverted view of a distributed auxiliary hub 604, in accordance with some described embodiments. The distributed auxiliary hub 604 may include any features shown and described for the distributed auxiliary hub 504 (shown in FIG. 5A). As shown, the distributed auxiliary hub 604 includes a circuit board 642a and a circuit board 642b. The distributed auxiliary hub 604 further includes an inductor 648a and an inductor 648b, each of which extend and pass through an opening 654 in the circuit board 642b. The inductor 648a and the inductor 648b are covered by a shield 656. As a result, the shield 656 may protect/block EMI from interfering with the inductor 648a and the inductor 648b. The circuit board 642a includes a mounting surface 646 that carries an electrical connector 682 in the form of electrical pads. When the distributed auxiliary hub 604 is connected to a dock flex (such as the dock flex 230, shown in FIGS. 2, 3, 4D, and 4E), the electrical connector 682 is capable of electrically connecting with electrical contacts of the dock flex.

Figure 6:
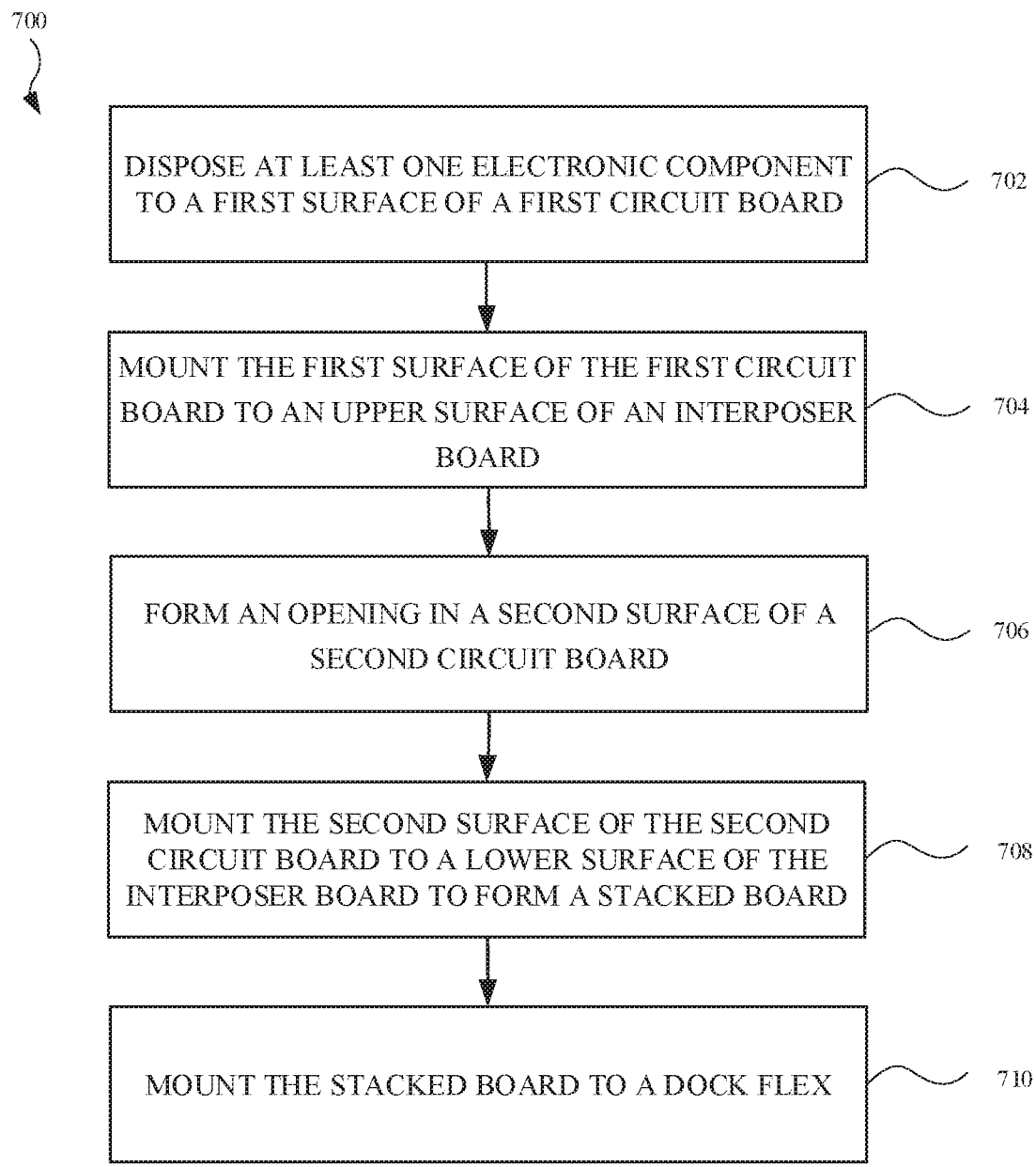
FIG. 6 illustrates a method for forming a distributed auxiliary hub, in accordance with some embodiments.

FIG. 6 illustrates a method 700 for forming a circuit assembly, in accordance with some embodiments. The method 700 may be used to form a circuit assembly that includes a distributed auxiliary hub, shown and described herein.

At step 702, at least one electronic component is disposed onto a first surface of a first circuit board. The electronic component(s) may include integrated circuitry, such as a haptic feedback circuit 214, an acoustic speaker circuit 216, power circuitry, and/or dock flex circuitry.

At step 704, an interposer board is mounted to one of the surfaces of the first circuit board. The interposer board may include conductive pins designed to electrically connect to the aforementioned circuit board as well as a second circuit board.

At step 706, an opening is formed within a mounting surface of the second circuit board. The opening can accommodate one or more components, including one or more inductors. The second circuit board may also include a shield that acts as an EMI shield for the one or more inductors.

At step 708, the interposer board is mounted to the mounting surface of the second circuit board to form a stacked circuit assembly. The stacked circuity configuration may include the interposer board positioned between the first circuit board and the second circuit board. As a result, at least some of the electrical components located on the first circuit board and/or the second circuit board are covered and protected by the interposer board.

At step 710, the stacked circuit assembly is mounted onto a dock flex. The dock flex is designed to connect the stacked circuit assembly to an external source. In some embodiments, the dock flex is directly connected to the distributed auxiliary hub, rather than a (separate) main logic board.

Figure 7:
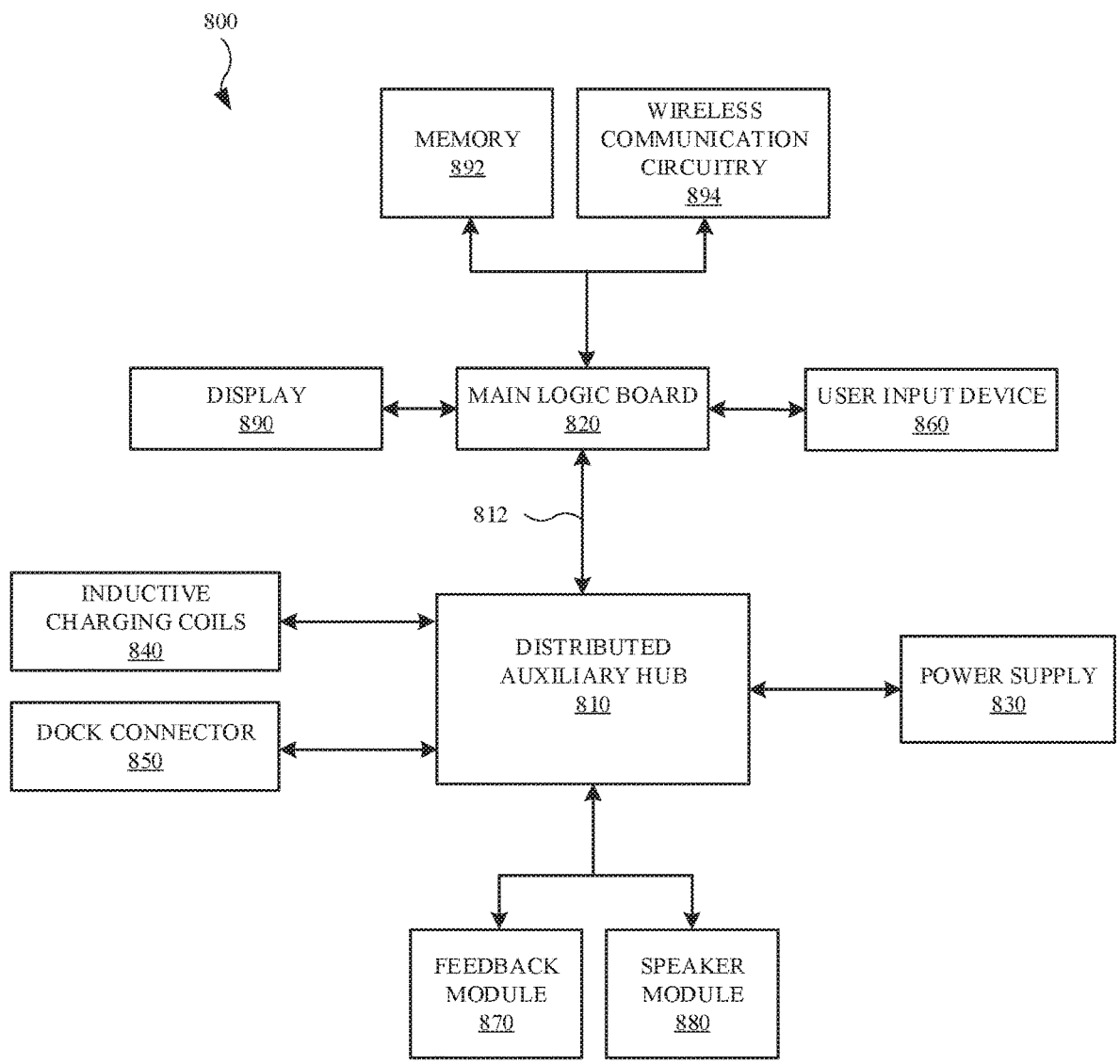
FIG. 7 illustrates a system diagram of a portable electronic device that is capable of implementing the various techniques described herein, according to some embodiments.

FIG. 7 illustrates a system diagram of a portable electronic device 800 that is capable of implementing the various techniques described herein, according to some embodiments. The portable electronic device 800 may include any features shown and described for the portable electronic device 100 (shown in FIGS. 1A-3). Conversely, the portable electronic device 100 (shown in FIGS. 1A-3) may include any features shown and described for the portable electronic device 800.

The portable electronic device 800 includes a distributed auxiliary hub 810 is connected to a main logic board 820 via a dock flex 812. The portable electronic device 800 may further include a power supply 830 (e.g., a battery) that supplies power to components of the portable electronic device 800, inductive charging coils 840 that are used for wireless charging, a dock connector 850 configured to electrically connect the portable electronic device 800 to an external source, a user input device 860 (e.g., buttons, switches, and/or a capacitive touch input display), a feedback module 870 (e.g., haptic feedback component), and a speaker module 880 (e.g., acoustic speaker module), a display 890, memory 892 (e.g., flash memory, semiconductor solid state memory, Random Access Memory, and/or Read-Only Memory ROM), and wireless communication circuitry 894 (e.g., BLUETOOTH® and WI-FI® circuitry).

The distributed auxiliary hub 810, as opposed to the main logic board 820, may include circuitry, including integrated circuity, used to communicate to and/or control the power supply 830, the inductive charging coils 840, dock connector 850, the feedback module 870, and the speaker module 880. In this regard, the distributed auxiliary hub 810 is capable of receiving electrical signals directly from an external source that is electrically coupled to the dock connector 850. In response to receiving the electrical signals from the external source, the distributed auxiliary hub 810 is capable of transmitting the electrical signals directly to at least one of the main logic board 820, the power supply 830, the feedback module 870 and/or the speaker module 880.

Additionally, the distributed auxiliary hub 810 is directly connected to the inductive charging coils 840. In response to receiving electrical signals from the inductive charging coils 840, the distributed auxiliary hub 810 is capable of transmitting the electrical signals directly to at least one of the main logic board 820, the power supply 830, the feedback module 870 and/or the speaker module 880.

Upon receiving the electrical signals via the dock flex 812, the main logic board 820 is capable of transmitting the electrical signals to other electronic components, such as the user input device 860 and the display 890. Other electronic components controlled by the main logic board 820 may include the memory 892 and the wireless communication circuitry 894.

Any ranges cited herein are inclusive. The terms "substantially", "generally," and "about" used herein are used to describe and account for small fluctuations. For example, they can refer to less than or equal to ±5%, such as less than or equal to ±2%, such as less than or equal to ±1%, such as less than or equal to ±0.5%, such as less than or equal to ±0.1%.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing line. The computer readable medium is any data storage device that can store data which can thereafter be read by a computer system. Examples of the computer readable medium include read-only memory, random-access memory, CD-ROMs, HDDs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. A portable electronic device, comprising:
an enclosure that defines a cavity, the enclosure comprising a wall; and
internal components located in the cavity, the internal components comprising:
a dock connector secured with the wall,
a main logic board,
a dock flex electrically connected to the dock connector and the main logic board, and
a circuit assembly positioned on and electrically coupled to the dock flex, the circuit assembly configured to direct an electrical signal between the dock connector and the main logic board.

2. The portable electronic device of claim 1, further comprising an internal power supply located between the circuit assembly and the main logic board.

3. The portable electronic device of claim 1, wherein the circuit assembly is separate from the main logic board.

4. The portable electronic device of claim 3, further comprising:
a haptic feedback module; and
an acoustic speaker module, wherein the circuit assembly comprises:
a haptic feedback circuit configured to transmit a first control signal to the haptic feedback module, and
an acoustic speaker circuit configured to transmit a second control signal to the acoustic speaker module, the first control signal different from the second control signal.

5. The portable electronic device of claim 3, further comprising an inductive charging coil electrically coupled and capable of transmitting an electrical current to the circuit assembly.

6. The portable electronic device of claim 1, wherein the circuit assembly comprises:
a first circuit board;
an interposer board connected to the first circuit board; and
a second circuit board connected to the interposer board.

7. The portable electronic device of claim 6, wherein the interposer board is positioned between the first circuit board and the second circuit board.

8. The portable electronic device of claim 6, further comprising an inductor connected to the interposer board, wherein the second circuit board comprises an opening, and wherein the inductor passes through the opening.

9. The portable electronic device of claim 8, wherein the second circuit board comprises a shield that covers the opening and the inductor.

10. A portable electronic device, comprising:
an enclosure;
a main logic board;
a circuit assembly, comprising:
a first circuit board having a first conductive element, a second circuit board having a second conductive element, and an interposer board disposed between the first circuit board and the second circuit board, wherein the interposer board includes an electrically conductive pin electrically connected to the first conductive element and the second conductive element;

a flexible circuit comprising electrical contacts that electrically couple to the circuit assembly; and a dock connector having a dock connector housing that is secured with the enclosure, wherein an electrical signal is capable of being passed between the dock connector, the circuit assembly, and the main logic board.

11. The portable electronic device of claim 10, wherein the dock connector is capable of passing the electrical signal directly to the circuit assembly via the electrical contacts without the electrical signal passing through the flexible circuit and to the main logic board.

12. The portable electronic device of claim 11, further comprising an internal power supply electrically coupled to and capable of receiving the electrical signal from the circuit assembly without the electrical signal passing to the main logic board.

13. The portable electronic device of claim 10, wherein the circuit assembly further comprises:

an inductor, wherein the interposer board defines a cavity, and wherein the inductor disposed in the cavity; and an electromagnetic interference shield that covers the inductor.

14. The portable electronic device of claim 13, wherein the inductor comprises:

a width; and a height that is greater than the width.

* * * * *